(12) United States Patent
Huss et al.

(10) Patent No.: US 12,739,153 B1
(45) Date of Patent: Sep. 15, 2026

(54) ADC OFFSET CORRECTION WITH PARTIAL UNSCRAMBLED DATA

(71) Applicant: Cadence Design Systems, Inc., San Jose, CA (US)

(72) Inventors: Scott David Huss, Cary, NC (US); Mark A. Summers, Cary, NC (US); Kelvin E. McCollough, Garner, NC (US); Matthew Robert Collin, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 31 days.

(21) Appl. No.: 18/952,871

(22) Filed: Nov. 19, 2024

(51) Int. Cl.

| | |
|---|---|
| ***H04L 25/03*** | (2006.01) |
| ***H03L 7/08*** | (2006.01) |
| ***H03M 1/10*** | (2006.01) |

(52) U.S. Cl.
CPC ...... *H04L 25/03019* (2013.01); *H03L 7/0807* (2013.01); *H03M 1/1023* (2013.01)

(58) Field of Classification Search
CPC ......... H03L 7/0807; H03L 7/18; H03L 7/189; H03L 7/195; H03L 7/1974; H03M 1/1023; H03M 1/124; H03M 1/1245; H03M 1/1255; H04L 7/0004; H04L 7/0025; H04L 7/0079; H04L 7/0087; H04L 7/10; H04L 25/03019; H04L 27/2271; H04L 27/2272; H04L 27/2273
USPC ....... 375/231, 232, 326–328, 362, 373, 375, 375/376; 327/144, 146, 147; 713/400, 713/500, 501, 503, 600
See application file for complete search history.

(56) References Cited

U.S. PATENT DOCUMENTS 8,737,490 B1 * 5/2014 Wilson .............. H04L 25/03057 375/244
8,942,334 B1 * 1/2015 Zortea .................. H04L 7/0334 375/355
9,712,349 B1 * 7/2017 Lu ........................... H04L 5/006
9,800,438 B1 * 10/2017 Zhang ............... H04L 25/03885
10,868,663 B1 * 12/2020 Turker Melek ....... H04L 7/0004
2008/0124092 A1 * 5/2008 Dvir ...................... H04L 7/0337 398/155
2008/0219390 A1 * 9/2008 Simpson ................ H04L 7/033 375/355

* cited by examiner

*Primary Examiner* — Young T. Tse
(74) *Attorney, Agent, or Firm* — Schwegman Lundberg & Woessner, P.A.

(57) ABSTRACT

Methods and systems are provided for training an analog-to-digital converter (ADC) of a receiver. The methods and systems access a training sequence comprising a plurality of unscrambled portions interleaved with a plurality of scrambled portions and destabilize a clock data recovery (CDR) component to generate a random frequency offset. The methods and systems instruct an ADC to sample the training sequence, using a set of clock signals generated by the phase interpolator (PI) using the CDR component based on the random frequency offset, to generate a set of digital symbols representing the plurality of unscrambled portions and the plurality of scrambled portions. The methods and systems calibrate an ADC offset based on the training sequence that has been sampled by the ADC using the set of clock signals generated by the PI using the CDR component based on the random frequency offset.

20 Claims, 8 Drawing Sheets

ADC OFFSET CORRECTION WITH PARTIAL UNSCRAMBLED DATA

TECHNICAL FIELD

The present disclosure generally relates to the adaptive equalization in high-speed serial interfaces, particularly for Peripheral Component Interconnect Express (PCIe) receivers, to mitigate intersymbol interference (ISI).

BACKGROUND

High-speed serial interfaces, such as those used in PCIe systems, face challenges in maintaining signal integrity and reliable data transmission as data rates continue to increase. These interfaces contend with various channel impairments, including ISI, which can degrade signal quality and increase bit error rates. To address these issues, modern receivers employ sophisticated adaptive equalization techniques, such as Decision Feedback Equalizers (DFE) and Feed-Forward Equalizers (FFE), often in conjunction with adaptive algorithms like Least Mean Squares (LMS). These equalization methods work to compensate for channel-induced distortions and optimize signal recovery.

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate examples of the present inventive subject matter and cannot be considered as limiting its scope.

DETAILED DESCRIPTION

Figure 1:
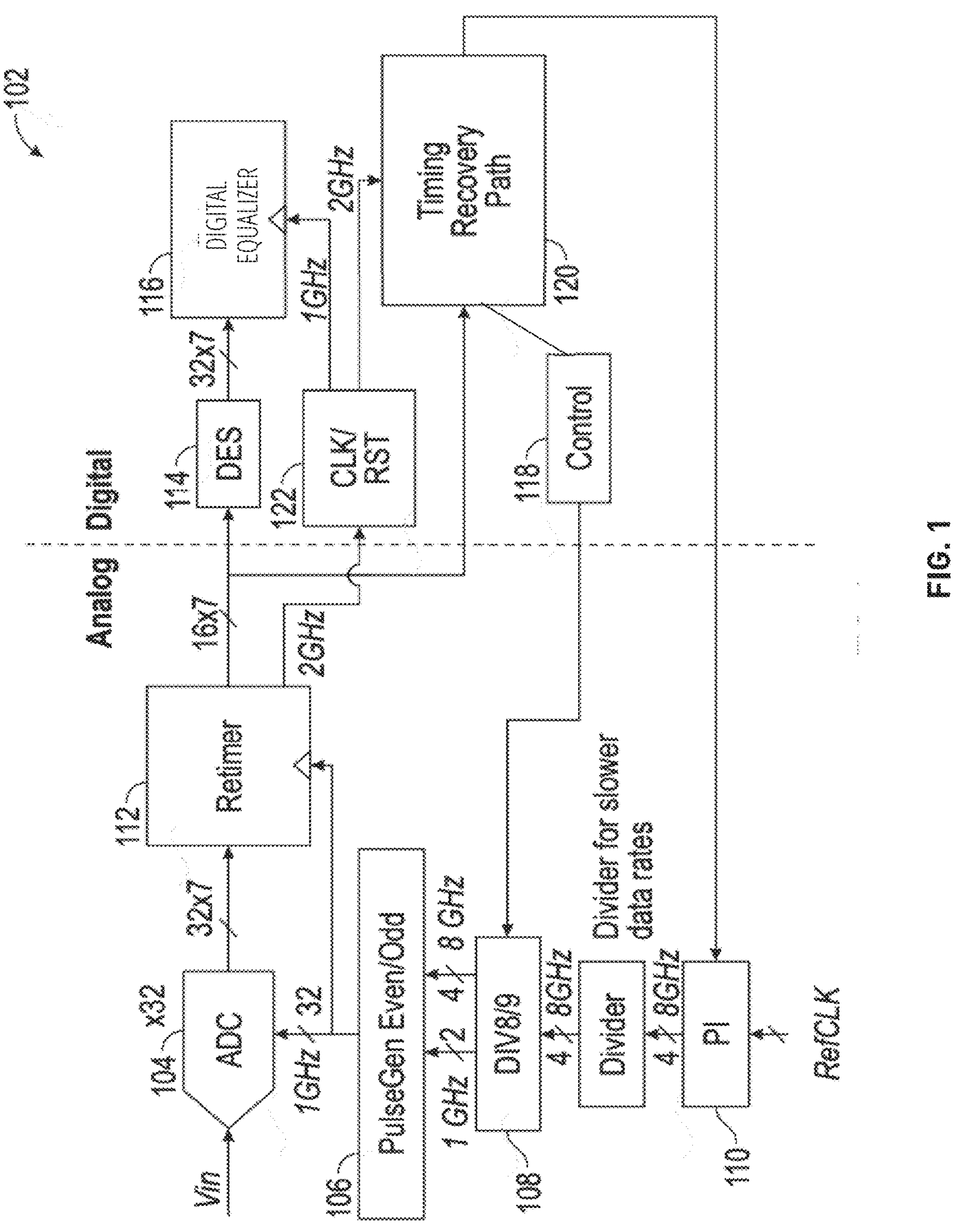
FIG. 1 illustrates a PCIE receiver, in accordance with some examples.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

ADC offset in PCIe (or PCIE) receivers refers to the systematic error in ADCs that causes the digital output to deviate from the true analog input value. This offset can adversely impact the accuracy of signal conversion, such as in new generation high-speed interfaces. Proper calibration of ADC offset is important for maintaining signal integrity and minimizing bit error rates in data transmission.

The adaptation of ADC offset correction presents significant challenges when dealing with training sequences that lack randomness, particularly in the context of new generation PCIE interfaces. In new generation PCIE training sequences, 8 interleaves (ILVs) consistently see a constant +3V or −3V from the transmitter and lack randomness. This lack of randomness in the training sequence causes the offset correction to calibrate incorrectly. Specifically, four of the ADCs may consistently sample a signal with a transmitted +3V or −3V, leading to biased adaptation.

The lack of randomness in the training sequence affects the ADC offset correction in two primary ways. First, biased adaptation occurs when the consistent +3V or −3V patterns in certain interleaves cause the offset correction to adapt to these specific levels rather than the true center of the signal. This biased adaptation can lead to systematic errors in the ADC's output. Second, incomplete characterization of the signal occurs because the offset correction algorithm relies on seeing a variety of signal levels to accurately determine the true offset. When the training sequence lacks randomness, the algorithm fails to receive a complete picture of the signal characteristics, potentially leading to suboptimal correction.

These issues with ADC offset adaptation due to non-random training sequences can impact the overall performance of the PCIE receiver. Incorrect offset calibration can lead to increased bit error rates, reduced signal integrity, and ultimately, degraded system performance. To address these challenges, the disclosed techniques introduce randomness into the sampling process, even when the training sequence itself lacks randomness. The disclosed techniques use a Clock and Data Recovery (CDR) circuit to generate random sampling frequencies.

One approach in the disclosed solution causes the CDR circuit to generate random sampling frequencies. This is achieved by manipulating the CDR loop filter parameters, specifically by increasing the integral gain (KI) and decreasing the proportional gain (KP) to make the CDR loop unstable. This instability causes the sampling frequency to vary randomly, effectively randomizing the samples taken from the training sequence. This technique helps prevent biased adaptation and ensure that all ADC slices are exposed to a variety of signal levels, leading to more accurate offset calibration and improved overall performance of the PCIE receiver.

In some examples, the disclosed receiver includes an ADC, a CDR component coupled to the ADC via a PI, and one or more processors configured to perform specific operations. One operation involves accessing a training sequence that includes a plurality of unscrambled portions interleaved with scrambled portions. In some cases, these unscrambled portions are equally interleaved with the scrambled portions in an analog training sequence processed by the ADC. An aspect of this solution is the deliberate destabilization of the CDR component to generate a random frequency offset. This destabilization can be achieved through various means. For example, the CDR component may include an integral path and a proportional path, both coupled to receive a phase error from a low pass filter (LPF). The outputs of these paths are combined and integrated to provide a signal to the PI.

In some implementations, the destabilization process involves overriding the output of the integral path and temporarily disabling the proportional path during the calibration of the ADC offset. For instance, a multiplexor may be used to select between a signal generated by applying an integral path constant to the phase error and a training signal. This training signal could be a constant value or, in some cases, a random frequency signal generated using a linear feedback shift register (LFSR).

Another approach to destabilizing the CDR involves manipulating the gains of the integral and proportional paths. For example, during calibration, the proportional gain may be set smaller than the integral gain by a specified amount. This configuration is reversed when the ADC samples a data signal after calibration is completed. The ADC is then instructed to sample the training sequence using clock signals generated by the PI based on the random frequency offset. This process generates a set of digital symbols representing both the unscrambled and scrambled portions of the training sequence. The ADC offset is then calibrated based on this sampled training sequence.

In some implementations, the sampling clock of the ADC may be randomized to further destabilize the CDR component. Additionally, the plurality of unscrambled portions in both the training sequence and the resulting digital symbols may include four UIs (Unit Intervals). By introducing randomness into the sampling process, even when the training sequence itself lacks randomness, this approach effectively addresses the challenges of ADC offset adaptation in new generation PCIe receivers, leading to more accurate offset calibration and improved overall performance.

Reference will now be made in detail to specific examples for carrying out the disclosed subject matter. Examples are illustrated in the accompanying drawings, and specific details are set forth in the following description in order to provide a thorough understanding of the subject matter. It will be understood that these examples are not intended to limit the scope of the claims to the illustrated examples. On the contrary, they are intended to cover such alternatives, modifications, and equivalents as may be included within the scope of the disclosure.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 illustrates a PCIE receiver 102, in accordance with some examples. Specifically, FIG. 1 illustrates a high-level block diagram of a PCIE receiver 102, showcasing the integration of various components used for digital equalization adaptation with partially unscrambled data. The diagram is divided into two main sections: the analog and digital domains.

In the analog domain, the input signal is fed into the ADC 104. The ADC 104 is responsible for converting the analog input signal into a digital format, producing a 32×7 output that is subsequently processed by the retimer 112. The retimer 112 ensures that the digital signals are synchronized and aligned correctly for further processing.

The pulse generator 106 component generates non-overlapping sampling pulses for the ADC, operating at a frequency of 1 GHz. This component helps maintain the timing accuracy required for high-speed data processing. The clock divider 108 is a component that provides clock division functionality. This flexibility is important for adapting to different data rates and ensuring optimal performance of the receiver in processing a training sequence. The Phase Interpolator (PI) (phase interpolator 110) is used to fine-tune the phase of the clock signals, providing precise control over the timing of the data sampling process. This component helps achieve accurate data recovery in high-speed communication systems.

In the digital domain, the output from the retimer 112 is fed into the deserializer 114, which can operate on 16×7 data signals. The equalizer 116 is responsible for mitigating ISI by using past decision data to adjust the current data processing, thereby enhancing signal integrity. The equalizer 116 processes the 32×7 bit output from the deserializer 114 using one or more equalizer components, preparing the data for further transmission or processing. This path is optimized for high-speed data handling, ensuring minimal latency and maximum throughput.

The recovered clock signal 122 provides clock and reset signals to various components within the receiver, operating at frequencies of 1 GHz and 2 GHz. This block helps maintain synchronization across the system. The timing recovery 120 (also includes a feed forward equalizer, such as low pass filter 202) is responsible for recovering the timing information from the incoming data stream, ensuring that the data is sampled at the correct intervals. This path works in conjunction with the controller 118 (e.g., one or more processors or control circuits), which manages the overall operation of the receiver, adjusting parameters as needed to optimize performance.

Together, these components of the PCIE receiver 102 form a sophisticated system capable of handling high-speed data transmission with improved equalization and timing recovery, addressing the challenges posed by partially unscrambled data patterns in modern PCIe interfaces.

Figure 3:
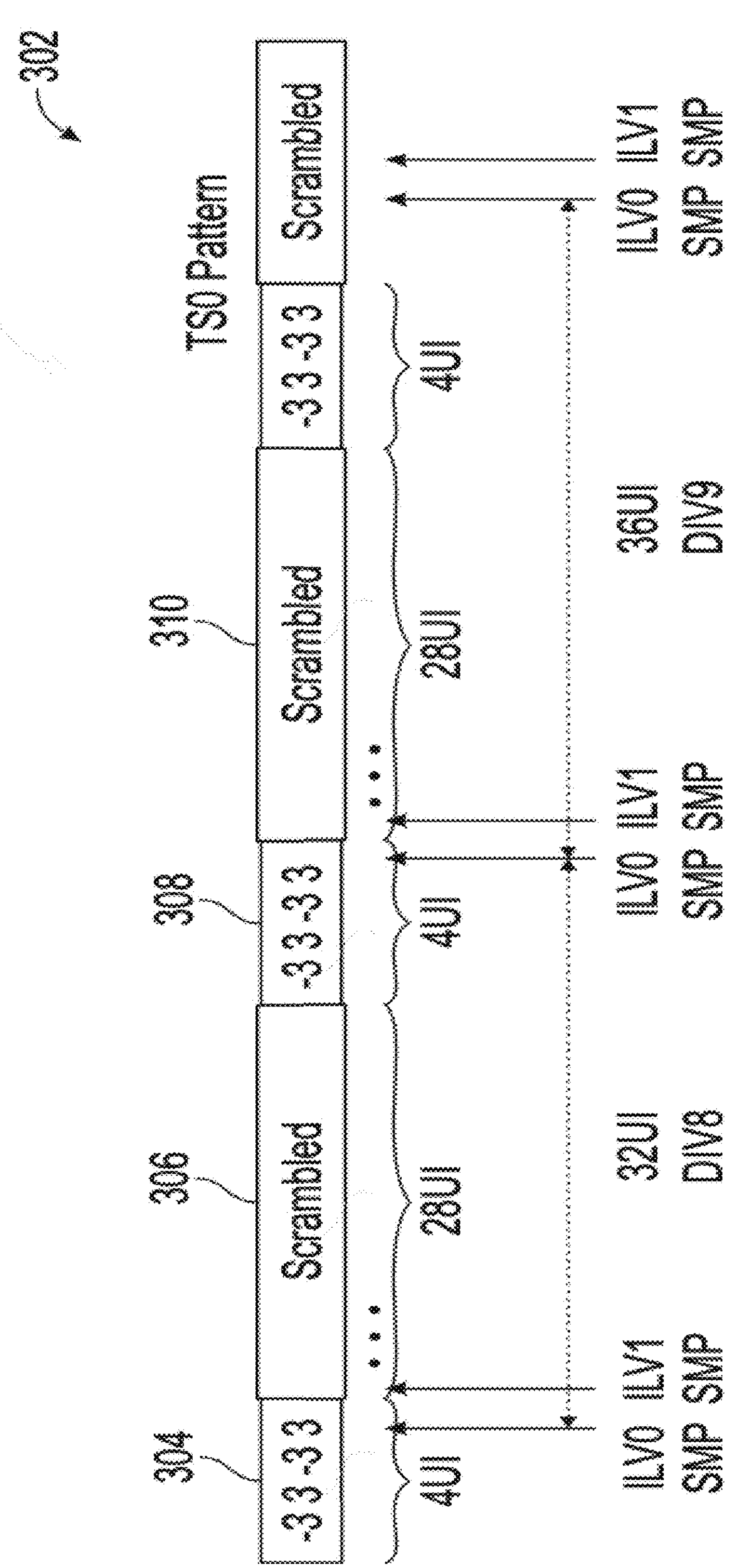
FIG. 3 illustrates a training sequence used by the PCIE receiver, in accordance with some examples.

Specifically, the controller 118 can perform operations to access a training sequence that includes a plurality of unscrambled portions interleaved with a plurality of scrambled portions. For example, as shown in FIG. 3, the controller 118 can access the training sequence 302. The training sequence 302 includes a first unscrambled data portion 304, a first scrambled data portion 306, a second unscrambled data portion 308, and a second scrambled data portion 310. The first unscrambled data portion 304 can include four unit intervals of data having a known or predetermined pattern (e.g., −3V, 3V, −3V, 3V) which can be decoded into a digital representation by the ADC 104 using a clock signal. Following the first unscrambled data portion 304, the first scrambled data portion 306 includes 28 unit intervals of scrambled data having an unknown or random pattern. Then, following the first scrambled data portion 306, another second unscrambled data portion 308 is provided having a known pattern corresponding to the same pattern as first unscrambled data portion 304. This second unscrambled data portion 308 is followed by another second scrambled data portion 310 of random scrambled data.

By processing the training sequence 302, the equalizer 116 of the PCIE receiver 102 can be trained. By processing the training sequence 302, the CDR in the timing recovery 120 of the PCIE receiver 102 can be trained to generate an appropriate offset for the clock signal used by the ADC 104.

The timing recovery 120 plays an important role in implementing the adaptive sampling technique used to address the challenges of ADC offset adaptation in the presence of training sequences with limited randomness. The timing recovery 120 is responsible for managing the destabilization of the CDR component to generate a random frequency offset. This destabilization is an important aspect of the solution described in the examples, as it introduces randomness into the sampling process even when the training sequence itself lacks randomness.

In some implementations, the timing recovery 120 may be configured to override the output of the integral path and temporarily disable the proportional path during the calibration of the ADC offset. For example, the timing recovery 120 may control a multiplexor that selects between a signal generated by applying an integral path constant to the phase error and a training signal, as discussed below. This training signal could be a constant value or, in some cases, a random frequency signal generated using a linear feedback shift register (LFSR).

The timing recovery 120 may also be responsible for manipulating the gains of the integral and proportional paths to destabilize the CDR. For instance, during calibration, it may set the proportional gain to be smaller than the integral gain by a specified amount. After calibration is completed, the timing recovery 120 would then reverse this configuration when the ADC 104 samples a data signal.

Furthermore, the timing recovery 120 may generate control signals to instruct the ADC 104 to sample the training sequence using clock signals generated by the phase interpolator 110 (PI) based on the random frequency offset. This process results in the generation of a set of digital symbols representing both the unscrambled and scrambled portions of the training sequence.

In some implementations, the timing recovery 120 may also be responsible for randomizing the sampling clock of the ADC 104 to further destabilize the CDR component. This additional randomization contributes to the overall effectiveness of the adaptive sampling technique.

By managing these various aspects of the CDR system, the timing recovery 120 plays a role in enabling the PCIE receiver 102 to effectively address the challenges of ADC offset adaptation in the presence of training sequences with limited randomness. This leads to more accurate offset calibration and improved overall performance of the PCIE receiver 102.

Figure 2:
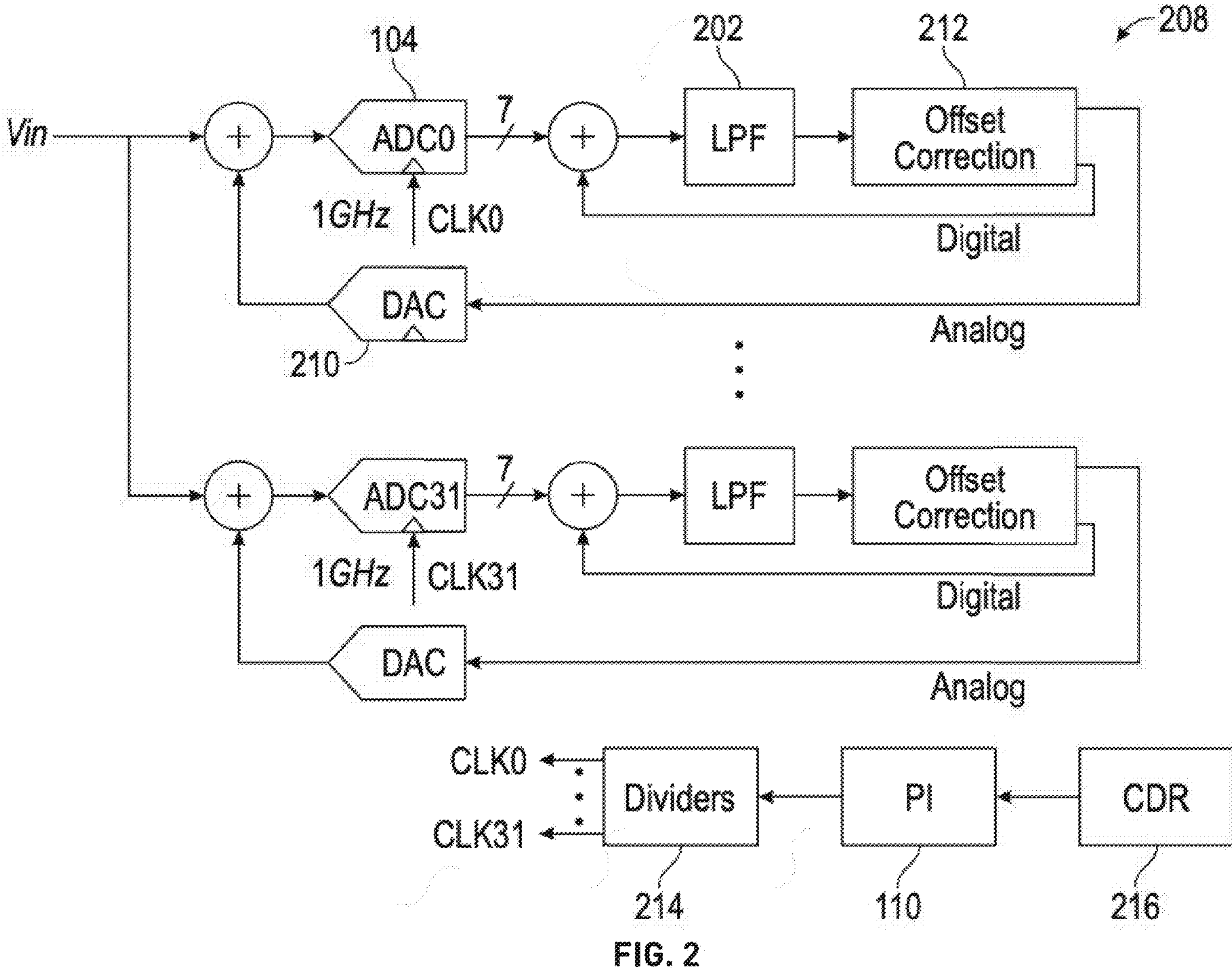
FIG. 2 illustrates a diagram of portions of the PCIE receiver, in accordance with some examples.

FIG. 2 illustrates a diagram 208 of portions of the PCIE receiver 102, in accordance with some examples. Specifically, FIG. 2 illustrates certain components of the disclosure for addressing ADC offset correction challenges in PCIE receivers 102 with partially unscrambled training sequences, such as those shown in FIG. 3. The components work together to implement the adaptive sampling technique. The ADC 104 is the analog-to-digital converter that samples the input signal Vin, including the training sequence 302 including both unscrambled and scrambled portions. The low pass filter 202 filters the digital output from the ADC 104, reducing high-frequency noise and providing an averaged ADC output signal to the ADC offset correction component 212.

The ADC offset correction component 212, part of the timing recovery 120, computes and applies the ADC offset correction using the filtered signal from the low pass filter 202. This component can be used in destabilizing the CDR 216 to introduce randomness during the calibration process. The output of the ADC offset correction component 212 is provided to the digital-to-analog converter 210 to provide a reference voltage to the ADC 104. The phase interpolator 110 generates precise clock phases based on the output from the ADC offset correction component 212, producing clock signals with random frequency offsets during calibration, which randomizes the sampling of the training sequence.

The clock divider 214 takes the output from the phase interpolator 110 and generates the actual clock signals used by the ADC 104 for sampling. In some cases, the clock divider 214 plays a role in implementing the adaptive clock division mechanism, which can insert divide-by-9 cycles to create controlled slips in the sampling process. These components work in concert to implement the adaptive sampling technique. The ADC offset correction component 212 destabilizes the CDR by manipulating its parameters, causing the phase interpolator 110 to generate clock signals with random frequency offsets. The clock divider 214 then uses these signals to create the sampling clock for the ADC 104. This process effectively randomizes the sampling of the training sequence, even when it contains unscrambled portions, allowing for more accurate ADC offset calibration. Different implementations of the CDR 216 are provided below in connection with FIGS. 4-6.

Figure 4:
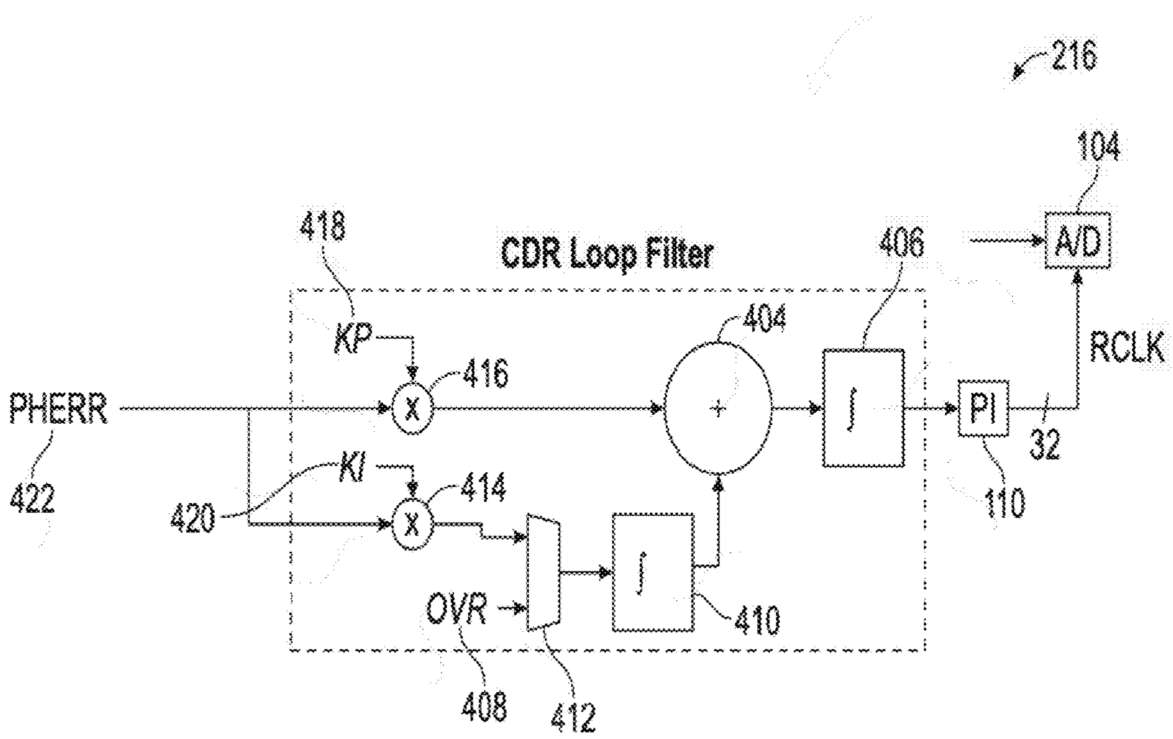
FIG. 4 illustrates a clock data recovery component of the PCIE receiver, in accordance with some examples.

FIG. 4 illustrates a clock data recovery component (e.g., CDR 216) of the PCIE receiver 102, in accordance with some examples. Specifically, FIG. 4 illustrates the components of the CDR loop filter, which plays a role in implementing the adaptive sampling technique for ADC offset correction. The phase error 422 is the input to the CDR loop filter, representing the difference between the expected and actual signal phase.

This phase error 422 is processed through two main paths: the proportional path and the integral path. In the proportional path, the phase error 422 is multiplied by a proportional path constant 418 (Kp) using the combiner 416 (e.g., a multiplier circuit). This operation provides a quick response to phase changes. The integral path involves multiplying the phase error 422 by an integral path constant 420 (Ki) using the combiner 414 (e.g., a multiplier circuit). The integral path helps to eliminate steady-state errors and provides long-term stability to the system.

In some examples, a multiplexor 412 can be placed in the integral path. This multiplexor 412 allows switching between the normal integral path output and a training signal 408. The training signal 408 can be a constant value used during the ADC offset calibration process to introduce randomness into the sampling. The output of the multiplexor 412 can then integrated by the integrator 410. This integration accumulates the error over time, which is important for maintaining lock on the input signal's frequency.

The outputs from both the proportional and integral paths are combined by the combiner 404 (e.g., a summing circuit, such as an adder). This summing operation produces the final control signal for the phase interpolator 110. Finally, an integrator 406 further processes the combined signal that is output from the combiner 404, providing additional filtering and stability to the overall CDR 216.

This configuration allows for the deliberate destabilization of the CDR during the ADC offset calibration process. By selecting the constant training signal 408 through the multiplexor 412, the system can introduce a random frequency offset, effectively randomizing the sampling of the training sequence. This technique is particularly useful when dealing with training sequences that contain both scrambled and unscrambled portions, as it helps to overcome the challenges associated with non-random patterns in the unscrambled sections. Specifically, for offset correction, the controller 118 can force a frequency offset by overriding the output of the integral path in the CDR 216 and disabling the proportional path.

Figure 5:
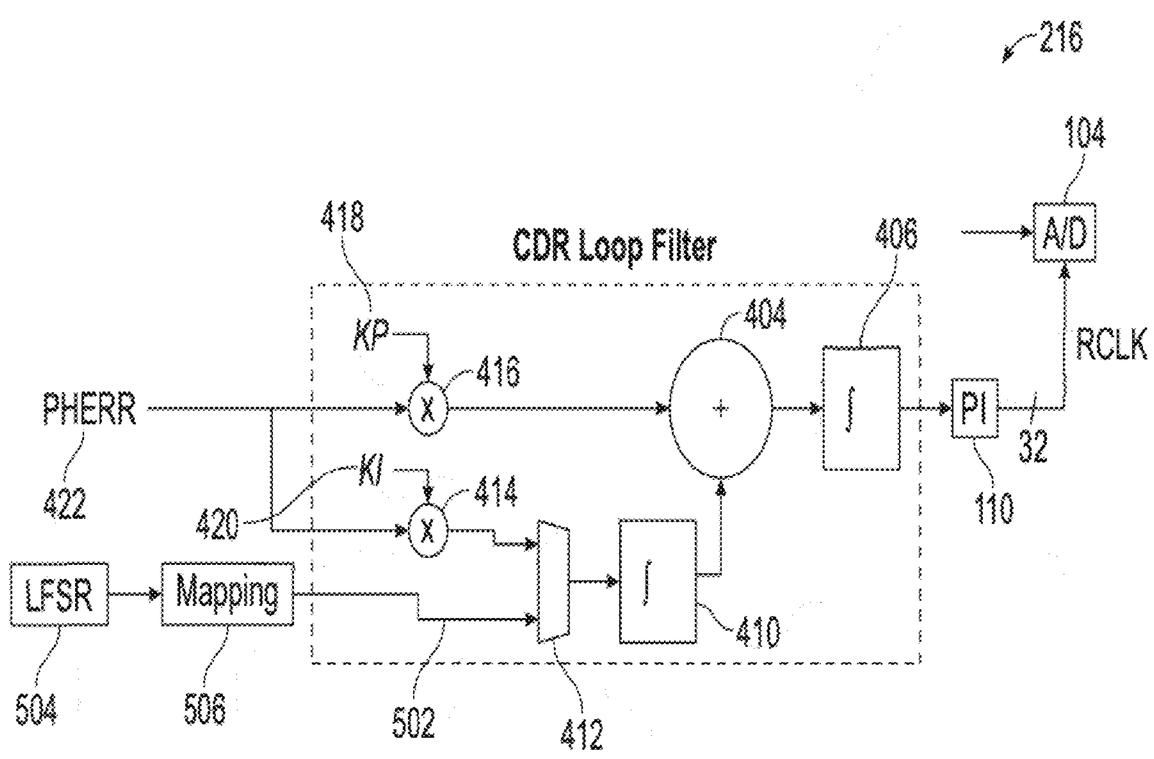
FIG. 5 illustrates a clock data recovery component of the PCIE receiver, in accordance with some examples.

FIG. 5 illustrates a clock data recovery component (e.g., CDR 216) of the PCIE receiver 102, in accordance with some examples. Specifically, FIG. 5 illustrates the components of the CDR loop filter, which plays a role in implementing the adaptive sampling technique for ADC offset correction. The phase error 422 is the input to the CDR loop filter, representing the difference between the expected and actual signal phase.

This phase error 422 is processed through two main paths: the proportional path and the integral path. In the proportional path, the phase error 422 is multiplied by a proportional path constant 418 (Kp) using the combiner 416 (e.g., a multiplier circuit). This operation provides a quick response to phase changes. The integral path involves multiplying the phase error 422 by an integral path constant 420 (Ki) using the combiner 414 (e.g., a multiplier circuit). The integral path helps to eliminate steady-state errors and provides long-term stability to the system.

In some examples, a multiplexor 412 can be placed in the integral path. This multiplexor 412 allows switching between the normal integral path output and a training signal 408. The training signal 408 can be a random value used during the ADC offset calibration process to introduce randomness into the sampling. The output of the multiplexor 412 can then integrated by the integrator 410. This integration accumulates the error over time, which is important for maintaining lock on the input signal's frequency.

In this configuration, the training signal 502 is not a constant value, but rather a random value generated by a linear feedback shift register 504. The linear feedback shift register 504 generates a random code between two predetermined values, such as M0 and M1. This random code is then passed through a frequency mapping component 506, which translates the random code into a specific frequency offset.

The frequency mapping component 506 can be designed to map the random code to a frequency offset between two values, such as FOS0 and FOS1. This mapping process allows for a controlled range of frequency offsets while still maintaining the randomness introduced by the linear feedback shift register 504. The resulting random frequency signal is used as the training signal 502 that is then fed into the multiplexor 412. This configuration allows for a more dynamic and unpredictable destabilization of the CDR during the ADC offset calibration process.

By using this LFSR-based random frequency generation, the system can more effectively randomize the sampling of the training sequence, even when dealing with partially unscrambled data. This approach helps to overcome the challenges associated with non-random patterns in the unscrambled sections of the training sequence, leading to more accurate ADC offset calibration in PCIE Gen6 receivers.

The outputs from both the proportional and integral paths are combined by the combiner 404 (e.g., a summing circuit, such as an adder). This summing operation produces the final control signal for the phase interpolator 110. Finally, an integrator 406 further processes the combined signal that is output from the combiner 404, providing additional filtering and stability to the overall CDR 216.

This configuration allows for the deliberate destabilization of the CDR during the ADC offset calibration process. By selecting the constant training signal 408 through the multiplexor 412, the system can introduce a random frequency offset, effectively randomizing the sampling of the training sequence. This technique is particularly useful when dealing with training sequences that contain both scrambled and unscrambled portions, as it helps to overcome the challenges associated with non-random patterns in the unscrambled sections.

Figure 6:
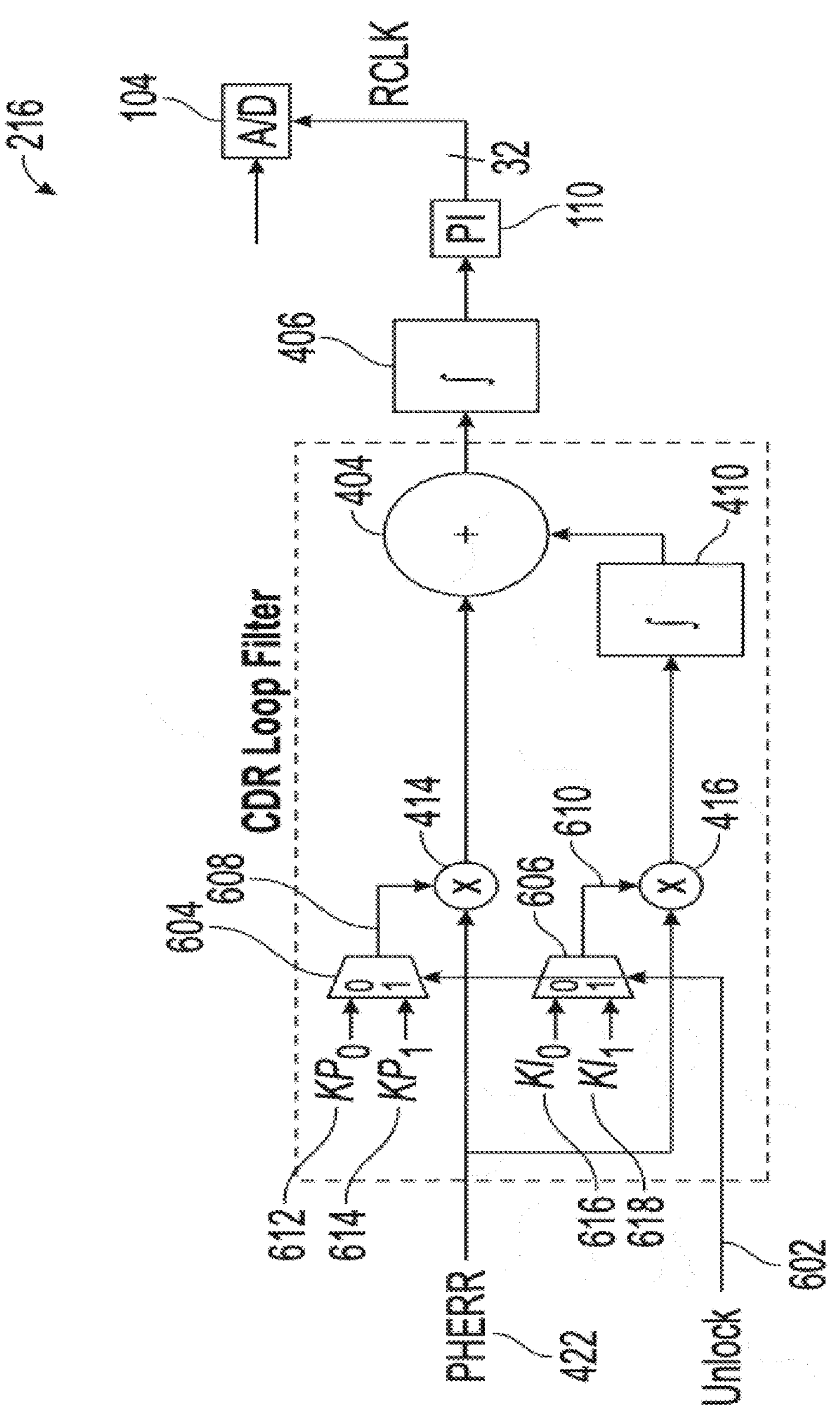
FIG. 6 illustrates a clock data recovery component of the PCIE receiver, in accordance with some examples.

FIG. 6 illustrates a clock data recovery component (e.g., CDR 216) of the PCIE receiver 102, in accordance with some examples. Specifically, FIG. 6 illustrates an advanced configuration of the CDR loop filter that allows for dynamic adjustment of the proportional and integral gains during ADC offset calibration. This configuration, shown in FIG. 6, provides a more flexible approach to destabilizing the CDR 216 and introducing randomness into the sampling process.

The design incorporates two sets of path constants including a first proportional path constant 612 and a second proportional path constant 614. The path constants also include a first integral path constant 616 and a second integral path constant 618. These constants represent different gain values that can be selected based on the operational mode of the system.

Two multiplexors, a first multiplexor 604 and a second multiplexor 606, can be used to switch between these different path constants. The first multiplexor 604 selects between the first proportional path constant 612 (KP0) and the second proportional path constant 614 (KP1). Similarly, the second multiplexor 606 selects between the first integral path constant 616 (KI0) and the second integral path constant 618 (KI1). The selection of these path constants is controlled by the unlock signal 602 generated by the controller 118.

When the unlock signal 602 is asserted, it causes the first multiplexor 604 and second multiplexor 606 to select the second set of constants (KP1 and KI1) (e.g., second proportional path constant 614 and second integral path constant 618). This configuration is designed to destabilize the CDR 216 by setting the proportional gain (KP1) to be significantly smaller than the integral gain (KI1). Namely, the second proportional path constant 614 can be of a significantly smaller value than the second integral path constant 618, such as by more than a specified threshold amount.

During normal operation, when the unlock signal 602 is de-asserted by the controller 118, the first multiplexor 604 and the second multiplexor 606 select the first set of constants (KP0 and KI0) (e.g., the first proportional path constant 612 and the first integral path constant 616). In this configuration, the integral gain (KI0) is smaller than the proportional gain (KP0), which is the typical setup for stable CDR operation. Namely, the first integral path constant 616 can be of a significantly smaller value than the first proportional path constant 612, such as by more than a specified threshold amount.

In the context of FIG. 6, combiner 404, integrator 410, and integrator 406 continue to play roles in the CDR loop filter's operation, but with some modifications to accommodate the dynamic gain adjustment feature. The combiner component 404 still combines the outputs from both the proportional and integral paths of the CDR loop filter. However, in this configuration of FIG. 6, the inputs to the combiner 404 now come from the outputs of the first multiplexor 604 and second multiplexor 606, which select between different proportional and integral gain constants.

The integrator 410 remains positioned within the integral path of the CDR loop filter. It now receives the output from the second multiplexor 606, which selects between the first integral path constant 616 (KI0) and the second integral path constant 618 (KI1) based on the unlock signal 602. This allows for dynamic adjustment of the integral gain during different operational modes.

The integrator 406 continues to process the combined signal from the combiner 404. Its role in providing additional filtering and stability to the overall CDR system remains unchanged. However, the characteristics of the signal it processes may vary more dynamically due to the switchable gain constants, particularly when the system transitions between normal operation and the intentionally unstable state used for ADC offset calibration.

These components, working in conjunction with the new multiplexors and switchable gain constants, enable the CDR loop filter to transition smoothly between stable operation during normal data reception and an intentionally unstable state during ADC offset calibration. This flexibility is key to generating the random frequency offset needed for effective sampling of partially unscrambled training sequences in PCIE receiver 102 that operate and are trained using the training sequence 302.

This dynamic switching capability allows the system to transition between stable operation during normal data reception and an intentionally unstable state during ADC offset calibration. By forcing the CDR 216 into an unstable state, the system can generate a random frequency offset, effectively randomizing the sampling of the training sequence. This technique is particularly useful for overcoming the challenges associated with partially unscrambled training sequences in next generation PCIE receivers 102, leading to more accurate ADC offset calibration.

Figure 7:
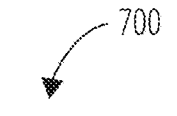
FIG. 7 illustrates a routine performed by the PCIE receiver, in accordance with some examples.
Figure 7:
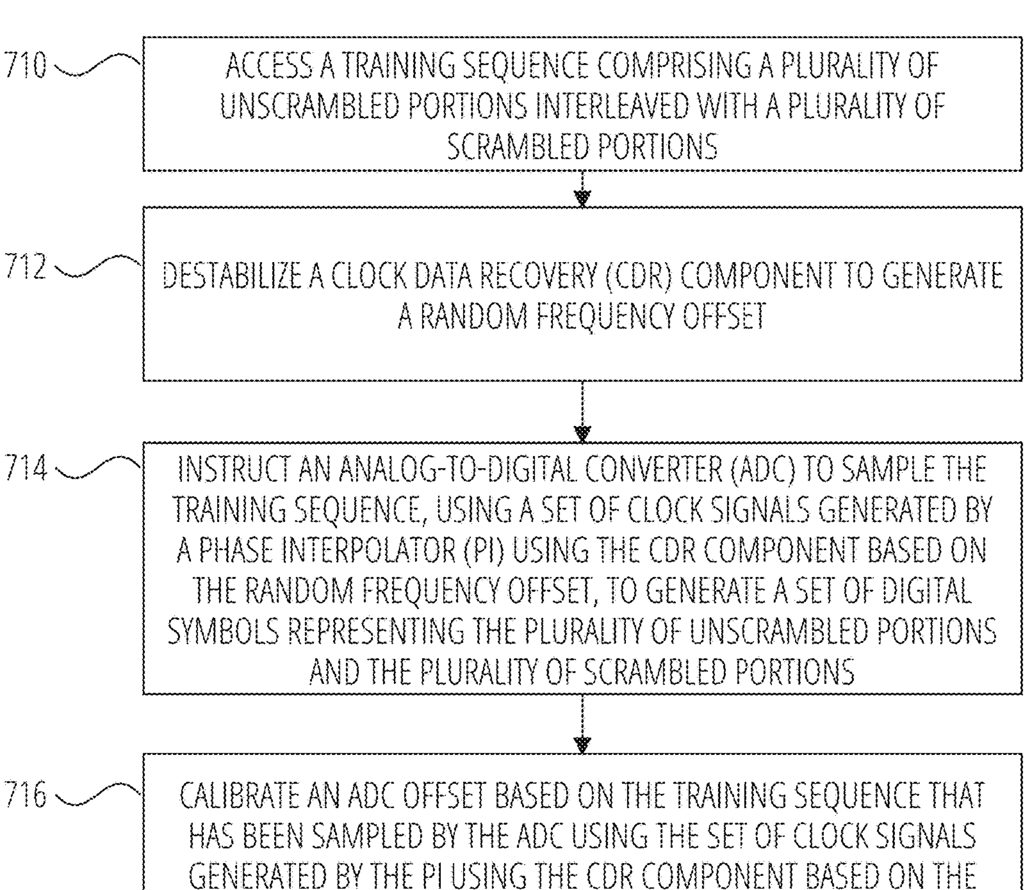

FIG. 7 illustrates a routine 700 (e.g., method or process) in accordance with some examples. The operations discussed in connection with FIG. 7 can be performed sequentially, in parallel, and in any suitable order. The operations discussed in FIG. 7 can be performed by the PCIE receiver 100.

In operation 710, routine 700 accesses a training sequence comprising a plurality of unscrambled portions interleaved with a plurality of scrambled portions. In operation 712, routine 700 destabilizes the CDR component to generate a random frequency offset. In operation 714, routine 700 instructs the ADC to sample the training sequence, using a set of clock signals generated by the PI using the CDR component based on the random frequency offset, to generate a set of digital symbols representing the plurality of unscrambled portions and the plurality of scrambled portions. In operation 716, routine 700 calibrates an ADC offset based on the training sequence that has been sampled by the ADC using the set of clock signals generated by the PI using the CDR component based on the random frequency offset.

Figure 8:
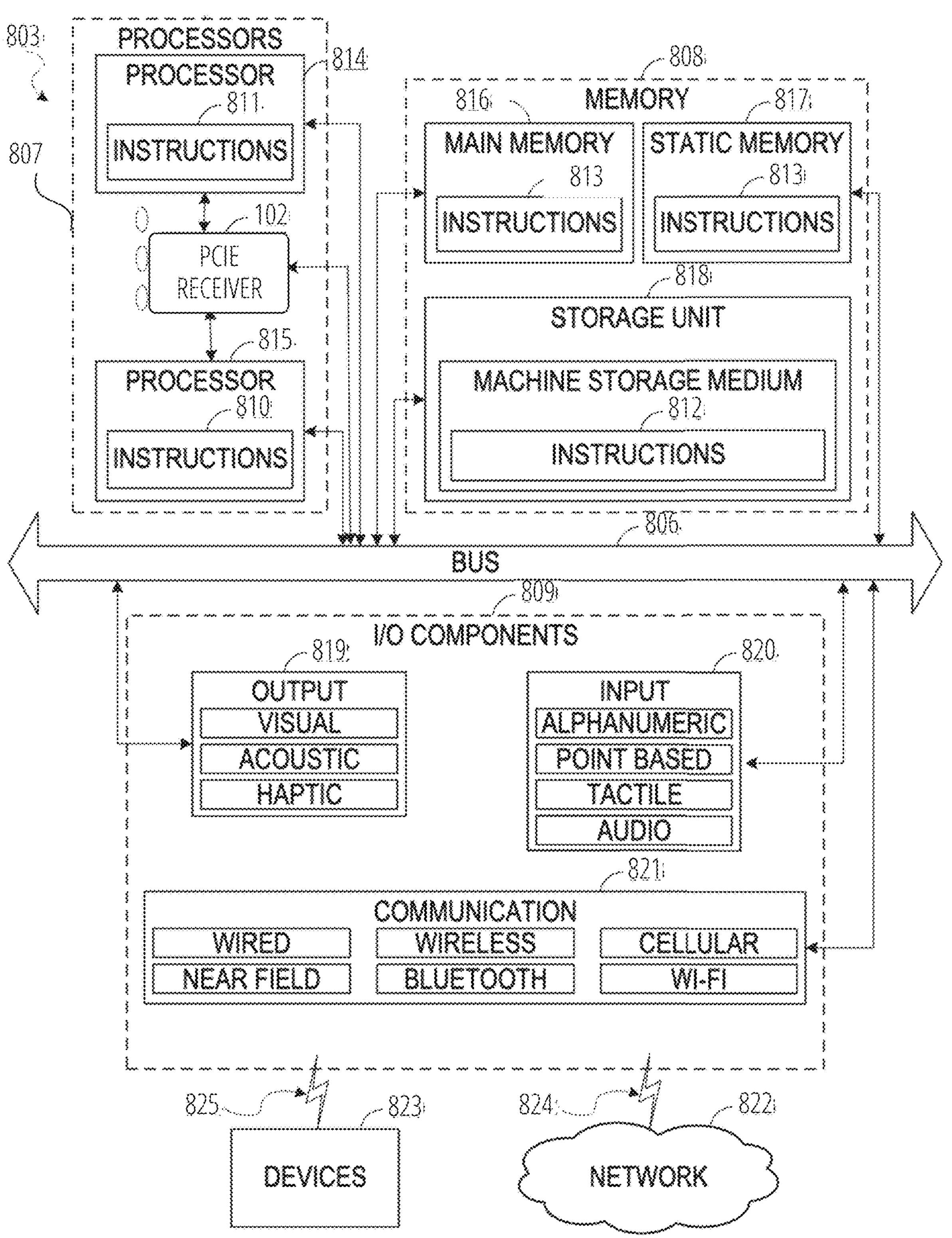
FIG. 8 is a functional block diagram of an example computing system for carrying out methods and operations described herein, in accordance with some examples.

FIG. 8 is a functional block diagram of a computing system 803 for executing the above methods and other processes described above, along with other examples. A machine is shown in the form of the computing system 803 within which a set of instructions may be executed for causing the machine to perform any one or more of the methods and other methodologies discussed herein, according to some examples. Specifically, FIG. 8 shows a diagrammatic representation of the machine in the example form of a computer system. The machine may include a bus 806, processors 807, memory 808, and I/O components 809, which may be configured to communicate with each other such as via the bus.

The machine may include instructions 810-813 (e.g., software, a program, an application, an applet, an app, or other executable code) for causing the machine to perform any one or more of the methodologies discussed herein. For example, the instructions 810-813 may cause the machine to execute a software system that executes the above processes described in the above description. The instructions 810-813 transform the general, non-programmed machine into a particular machine programmed to carry out the described and illustrated functions in the manner described here. In alternative examples, the machine operates as a standalone device or may be coupled (e.g., networked) to other machines. In a networked deployment, the machine may operate in the capacity of a server machine or a client machine in a server-client network environment, or as a peer machine in a peer-to-peer (or distributed) network environment. The machine may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 810-813, sequentially or otherwise, that specify actions to be taken by the machine. Further, while only a single machine is illustrated, the term "machine" shall also be taken to include a collection of machines that individually or jointly execute the instructions 810-813 to perform any one or more of the methodologies discussed herein.

In an example embodiment, the processors 807 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 814 and a processor 815 that may execute the instructions 811 and instructions 810. The term "processor" is intended to include multi-core processors 807 that may comprise two or more independent processors (sometimes referred to as "cores") that may execute instructions contemporaneously. Although FIG. 8 shows multiple processors 807, the machine 805 may include a single processor with a single core, a single processor with multiple cores (e.g., a multi-core processor), multiple processors with a single core, multiple processors with multiple cores, or any combination thereof.

The memory 808 may include a main memory 816, a static memory 817, and a storage unit 818, both accessible to the processors 807 such as via the bus 806. The main memory 816, the static memory 817, and the storage unit 818 store the instructions 812-1020 embodying any one or more of the processes, methodologies or functions described herein. The instructions 810-813 may also reside, completely or partially, within the main memory 816, within the static memory 817, within the storage unit 818, within at least one of the processors 807 (e.g., within the processor's cache memory), or any suitable combination thereof, during execution thereof by the computing system 803.

The I/O components 809 may include a wide variety of components to receive input, provide output, produce output, transmit information, exchange information, capture measurements, and so on. The specific I/O components 809 that are included in a particular machine will depend on the type of machine. For example, portable machines such as mobile phones will likely include a touch input device or other such input mechanisms, while a headless server machine will likely not include such a touch input device. It will be appreciated that the I/O components 809 may include many other components that are not shown in FIG. 8. The I/O components 809 are grouped according to functionality merely for simplifying the following discussion and the grouping is in no way limiting. In various example embodiments, the I/O components 809 may include output components 819 and input components 820. The output components 819 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 834 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 809 may include communication components 821 operable to couple the computing system 803 to a network 822 or devices 823 via a coupling 824 and a coupling 825, respectively. For example, the communication components 821 may include a network interface component or another suitable device to interface with the network 822. In further examples, the communication components 821 may include wired communication components, wireless communication components, cellular communication components, and other communication components to provide communication via other modalities. The devices 823 may be another machine or any of a wide variety of peripheral devices (e.g., a peripheral device coupled via a universal serial bus (USB)).

Executable Instructions and Machine Storage Medium

The various memories (e.g., 808, 816, static memory 817 and/or memory of the processors 807) and/or the storage unit 818 may store one or more sets of instructions and data structures (e.g., software) embodied or utilized by any one or more of the methodologies or functions described herein. These instructions, when executed by the processors 807, cause various operations to implement the disclosed examples.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 822 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 822 or a portion of the network 822 may include a wireless or cellular network, and the coupling 824 may be a Code Division Multiple Access (CDMA) connection, a Global System for Mobile communications (GSM) connection, or another type of cellular or wireless coupling. In this example, the coupling 824 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 810-813 may be transmitted or received over the network 822 using a transmission medium via a network interface device (e.g., a network interface component included in the communication components 821) and utilizing any one of a number of well-known transfer protocols (e.g., hypertext transfer protocol (HTTP)). Similarly, the instructions 812-813 may be transmitted or received using a transmission medium via the coupling 844 (e.g., a peer-to-peer coupling) to the devices 823. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 810-813 for execution by the computing system 803, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

In view of the disclosure above, various examples are set forth below. It should be noted that one or more features of an example, taken in isolation or combination, should be considered within the disclosure of this application.

Example 1. A Peripheral Component Interconnect Express (PCIE) receiver comprising: an analog to digital converter (ADC); a clock data recovery (CDR) component coupled to the ADC via a phase interpolator (PI); and one or more processors configured to perform operations comprising: accessing a training sequence comprising a plurality of unscrambled portions interleaved with a plurality of scrambled portions; destabilizing the CDR component to generate a random frequency offset; instructing the ADC to sample the training sequence, using a set of clock signals generated by the PI using the CDR component based on the random frequency offset, to generate a set of digital symbols representing the plurality of unscrambled portions and the plurality of scrambled portions; and calibrating an ADC offset based on the training sequence that has been sampled by the ADC using the set of clock signals generated by the PI using the CDR component based on the random frequency offset.

Example 2. The PCIE receiver of Example 1, wherein the training sequence is an analog training sequence processed by the ADC, and wherein the plurality of unscrambled portions is interleaved equally with the plurality of scrambled portions.

Example 3. The PCIE receiver of any one of Examples 1-2, wherein the CDR component is periodically destabilized.

Example 4. The PCIE receiver of any one of Examples 1-3, comprising: a low pass filter (LPF) coupled to the CDR, the CDR component comprising offset correction circuitry for computing the ADC offset; and a digital-to-analog converter (DAC) coupled to an output of the CDR component, wherein an output of the ADC is coupled to the LPF, an output of the PI being coupled to one or more clock dividers configured to generate the set of clock signals.

Example 5. The PCIE receiver of Example 4, wherein the CDR component comprises: an integral path; and a proportional path, the integral path and the proportional path being coupled to receive a phase error from the LPF, outputs of the integral path and the proportional path being combined and integrated to provide a signal to the PI, the integral path applying an integral path constant to the phase error and the proportional path applying a proportional path constant to the phase error.

Example 6. The PCIE receiver of Example 5, wherein the operations comprise: overriding an output of the integral path during calibration of the ADC offset to randomize effect of the plurality of scrambled portions; and temporarily disabling the proportional path during the calibration of the ADC offset.

Example 7. The PCIE receiver of Example 6, comprising: a multiplexor coupled to receive a first signal generated by applying the integral path constant to the phase error and a second signal comprising an training signal, an output of the multiplexor coupled via an integrator to a component that combines the outputs of the integral path and the proportional path, wherein the operations comprise: providing a select signal to the multiplexor to output the second signal during the calibration of the ADC offset while the ADC samples the training sequence and to output the first signal while the ADC samples a data signal.

Example 8. The PCIE receiver of Example 7, wherein the training signal comprises a constant value.

Example 9. The PCIE receiver of any one of Examples 7-8, wherein the training signal comprises a random frequency signal generated using a linear feedback shift register (LFSR).

Example 10. The PCIE receiver of Example 9, wherein the LFSR generates a random code between two values, and wherein the operations comprise accessing a map to select a frequency offset to generate the random frequency signal based on the random code.

Example 11. The PCIE receiver of any one of Examples 5-10, wherein the operations comprise: causing the proportional path to have a proportional gain that is smaller than an integral gain provided by the integral path by a specified amount during calibration of the ADC offset; and causing the integral path to have the integral gain that is smaller than the proportional gain provided by the proportional path when the ADC samples a data signal after calibration is completed.

Example 12. The PCIE receiver of Example 11, the operations comprise: a first multiplexor having first and second inputs coupled respectively to a first proportional path constant and a second proportional path constant, a first output of the first multiplexor comprising the proportional path constant coupled to a first component that combines the first output with the phase error; and a second multiplexor having first and second inputs coupled respectively to a first integral path constant and a second integral path constant, a second output of the second multiplexor comprising the integral path constant coupled to a second component that combines the second output with the phase error, the first integral path constant being smaller than the first proportional path constant, the second integral path constant being larger than the second proportional path constant.

Example 13. The PCIE receiver of Example 12, wherein the operations comprise: generating an unlock signal that is coupled to select inputs of the first and second multiplexors to destabilize the CDR component, the unlock signal when asserted causes the second input, comprising the second proportional path constant, of the first multiplexor to be coupled to the first output of the first multiplexor and causes the second input, comprising the second integral path constant, of the second multiplexor to be coupled to the second output of the second multiplexor.

Example 14. The PCIE receiver of Example 13, wherein the unlock signal when de-asserted causes the first input, comprising the first proportional path constant, of the first multiplexor to be coupled to the first output of the first multiplexor and causes the first input, comprising the first integral path constant, of the second multiplexor to be coupled to the second output of the second multiplexor.

Example 15. The PCIE receiver of any one of Examples 12-14, wherein an output of the second component is coupled via an integrator to a component that combines the outputs of the integral path and the proportional path.

Example 16. The PCIE receiver of any one of Examples 1-15, wherein the operations comprise randomizing a sampling clock of the ADC to destabilize the CDR component.

Example 17. The PCIE receiver of any one of Examples 1-16, wherein the plurality of unscrambled portions of the training sequence comprise four UIs and the plurality of unscrambled portions in the digital symbols comprise four UI.

Example 18. A method comprising: accessing a training sequence comprising a plurality of unscrambled portions interleaved with a plurality of scrambled portions; destabilizing a clock data recovery (CDR) component to generate a random frequency offset; instructing an analog-to-digital converter (ADC) to sample the training sequence, using a set of clock signals generated by a phase interpolator (PI) using the CDR component based on the random frequency offset, to generate a set of digital symbols representing the plurality of unscrambled portions and the plurality of scrambled portions; and calibrating an ADC offset based on the training sequence that has been sampled by the ADC using the set of clock signals generated by the PI using the CDR component based on the random frequency offset.

Example 19. The method of Example 18, wherein the training sequence is an analog training sequence processed by the ADC, and wherein the plurality of unscrambled portions are interleaved equally with the plurality of scrambled portions.

Example 20. A non-transitory computer-readable medium comprising computer-readable instructions that, when executed by one or more processors, cause the one or more processors to perform operations comprising: accessing a training sequence comprising a plurality of unscrambled portions interleaved with a plurality of scrambled portions; destabilizing a clock data recovery (CDR) component to generate a random frequency offset; instructing an analog-to-digital converter (ADC) to sample the training sequence, using a set of clock signals generated by a phase interpolator (PI) using the CDR component based on the random frequency offset, to generate a set of digital symbols representing the plurality of unscrambled portions and the plurality of scrambled portions; and calibrating an ADC offset based on the training sequence that has been sampled by the ADC using the set of clock signals generated by the PI using the CDR component based on the random frequency offset.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the examples of the present disclosure have been described with reference to specific examples, it will be evident that various modifications and changes may be made to these examples without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The examples illustrated are described in sufficient detail to enable those skilled in the art to practice the teachings disclosed herein. Other examples may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such examples of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific examples shown. This disclosure is intended to cover any and all adaptations or variations of various examples. Combinations of the above examples, and other examples not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, method or process that includes elements in addition to those listed after such a term in a claim is still deemed to fall within the scope of that claim.

What is claimed is:

1. A Peripheral Component Interconnect Express (PCIE) receiver comprising:

an analog-to-digital converter (ADC);

a clock data recovery (CDR) component coupled to the ADC via a phase interpolator (PI); and one or more processors configured to perform operations comprising:

accessing a training sequence comprising a plurality of unscrambled portions interleaved with a plurality of scrambled portions;

destabilizing the CDR component to generate a random frequency offset;

instructing the ADC to sample the training sequence, using a set of clock signals generated by the PI using the CDR component based on the random frequency offset, to generate a set of digital symbols representing the plurality of unscrambled portions and the plurality of scrambled portions; and calibrating an ADC offset based on the training sequence that has been sampled by the ADC using the set of clock signals generated by the PI using the CDR component based on the random frequency offset.

2. The PCIE receiver of claim 1, wherein the training sequence is an analog training sequence processed by the ADC, and wherein the plurality of unscrambled portions is interleaved equally with the plurality of scrambled portions.

3. The PCIE receiver of claim 1, wherein the CDR component is periodically destabilized.

4. The PCIE receiver of claim 1, further comprising:

a low pass filter (LPF) coupled to the CDR component, the CDR component comprising offset correction circuitry for computing the ADC offset; and a digital-to-analog converter (DAC) coupled to an output of the offset correction circuitry, wherein an output of the ADC is coupled to the LPF, and an output of the PI being coupled to one or more clock dividers configured to generate the set of clock signals.

5. The PCIE receiver of claim 4, wherein the CDR component comprises:

an integral path; and a proportional path, the integral path and the proportional path being coupled to receive a phase error from the LPF, outputs of the integral path and the proportional path being combined and integrated to provide a signal to the PI, and the integral path applying an integral path constant to the phase error and the proportional path applying a proportional path constant to the phase error.

6. The PCIE receiver of claim 5, wherein the operations further comprise:

overriding an output of the integral path during calibration of the ADC offset to randomize effect of the plurality of scrambled portions; and temporarily disabling the proportional path during the calibration of the ADC offset.

7. The PCIE receiver of claim 6, wherein the CDR component further comprises:

a multiplexor coupled to receive a first signal generated by applying the integral path constant to the phase error and a second signal comprising a training signal, an output of the multiplexor is coupled via an integrator to a component that combines the outputs of the integral path and the proportional path, wherein the operations further comprise:

providing a select signal to the multiplexor to output the second signal during the calibration of the ADC offset while the ADC samples the training sequence and to output the first signal while the ADC samples a data signal.

8. The PCIE receiver of claim 7, wherein the training signal comprises a constant value.

9. The PCIE receiver of claim 7, wherein the training signal comprises a random frequency signal generated using a linear feedback shift register (LFSR).

10. The PCIE receiver of claim 9, wherein the LFSR generates a random code between two values, and wherein the operations further comprise accessing a map to select a frequency offset to generate the random frequency signal based on the random code.

11. The PCIE receiver of claim 5, wherein the operations further comprise:

causing the proportional path to have a proportional gain that is smaller than an integral gain provided by the integral path by a specified amount during calibration of the ADC offset; and causing the integral path to have the integral gain that is smaller than the proportional gain provided by the proportional path when the ADC samples a data signal after calibration is completed.

12. The PCIE receiver of claim 11, wherein the CDR component further comprises:

a first multiplexor having first and second inputs coupled respectively to a first proportional path constant and a second proportional path constant, and a first output of the first multiplexor comprising the proportional path constant coupled to a first component that combines the first output with the phase error; and a second multiplexor having first and second inputs coupled respectively to a first integral path constant and a second integral path constant, and a second output of the second multiplexor comprising the integral path constant coupled to a second component that combines the second output with the phase error, wherein the first integral path constant is smaller than the first proportional path constant, and wherein the second integral path constant is larger than the second proportional path constant.

13. The PCIE receiver of claim 12, wherein the operations further comprise:

generating an unlock signal that is coupled to select inputs of the first and second multiplexors to destabilize the CDR component, the unlock signal when asserted causes the second input, comprising the second proportional path constant, of the first multiplexor to be coupled to the first output of the first multiplexor and causes the second input, comprising the second integral path constant, of the second multiplexor to be coupled to the second output of the second multiplexor.

14. The PCIE receiver of claim 13, wherein the unlock signal when de-asserted causes the first input, comprising the first proportional path constant, of the first multiplexor to be coupled to the first output of the first multiplexor and causes the first input, comprising the first integral path constant, of the second multiplexor to be coupled to the second output of the second multiplexor.

15. The PCIE receiver of claim 12, wherein an output of the second component is coupled via an integrator to a component that combines the outputs of the integral path and the proportional path.

16. The PCIE receiver of claim 1, wherein the operations further comprise randomizing a sampling clock of the ADC to destabilize the CDR component.

17. The PCIE receiver of claim 1, wherein the plurality of unscrambled portions of the training sequence comprises four unit intervals (UIs) and the plurality of unscrambled portions in the set of digital symbols comprises four UI.

18. A method comprising:

accessing a training sequence comprising a plurality of unscrambled portions interleaved with a plurality of scrambled portions;

destabilizing a clock data recovery (CDR) component to generate a random frequency offset:

instructing an analog-to-digital converter (ADC) to sample the training sequence, using a set of clock signals generated by a phase interpolator (PI) using the CDR component based on the random frequency offset, to generate a set of digital symbols representing the plurality of unscrambled portions and the plurality of scrambled portions; and calibrating an ADC offset based on the training sequence that has been sampled by the ADC using the set of clock signals generated by the PI using the CDR component based on the random frequency offset.

19. The method of claim 18, wherein the training sequence is an analog training sequence processed by the ADC, and wherein the plurality of unscrambled portions is interleaved equally with the plurality of scrambled portions.

20. A non-transitory computer-readable medium comprising computer-readable instructions that, when executed by one or more processors, cause the one or more processors to perform operations comprising:

accessing a training sequence comprising a plurality of unscrambled portions interleaved with a plurality of scrambled portions;

destabilizing a clock data recovery (CDR) component to generate a random frequency offset;

instructing an analog-to-digital converter (ADC) to sample the training sequence, using a set of clock signals generated by a phase interpolator (PI) using the CDR component based on the random frequency offset, to generate a set of digital symbols representing the plurality of unscrambled portions and the plurality of scrambled portions; and calibrating an ADC offset based on the training sequence that has been sampled by the ADC using the set of clock signals generated by the PI using the CDR component based on the random frequency offset.

* * * * *